United States Patent [19]
Ueda

[11] Patent Number: 5,311,071
[45] Date of Patent: May 10, 1994

[54] HIGH SPEED THRESHOLD CROSSING DETECTOR WITH RESET

[75] Inventor: Shunsaku Ueda, Carlsbad, Calif.

[73] Assignee: Silicon Systems, Inc., Tustin, Calif.

[21] Appl. No.: 779,963

[22] Filed: Oct. 21, 1991

[51] Int. Cl.⁵ .................. H03K 5/24; H03K 17/04
[52] U.S. Cl. ..................................... 307/355; 307/494
[58] Field of Search ............... 307/350, 355, 491, 494, 307/359

[56] References Cited
U.S. PATENT DOCUMENTS 3,857,047 12/1974 Knight .............................. 307/362
4,438,349 3/1984 Shoji ................................. 307/362

Primary Examiner—John Zazworsky
Attorney, Agent, or Firm—Hecker & Harriman

[57] ABSTRACT

The present invention provides a high speed, all CMOS comparator utilizing positive feedback and DC voltage clamping. The circuit comprises two source-coupled PMOS transistors with their sources coupled to a current source or a supply voltage. A third PMOS transistor is coupled between the source of the first PMOS transistor and a terminal of a current mirror. The gate of this third PMOS transistor is coupled to the output node in such a way as to provide positive feedback to the circuit. As the negative input voltage becomes lower than the positive input voltage, the current passing through the second PMOS transistor increases and the current passing through the first PMOS transistor decreases. As the output node increases in voltage, the equivalent resistance of the third PMOS transistor increases, thus decreasing the current through the first PMOS transistor. This acts to increase the current being provided to the output node and increases the drive characteristics of the circuit. As a further improvement to the circuit, a voltage-clamping device is included in the design.

29 Claims, 6 Drawing Sheets

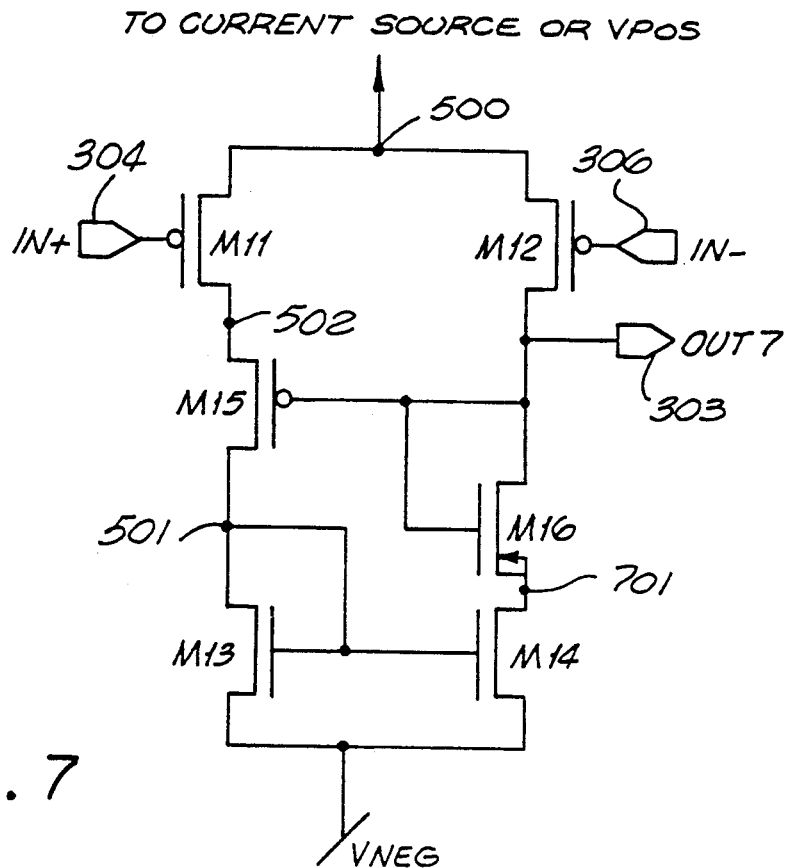
FIG. 7
FIG. 8
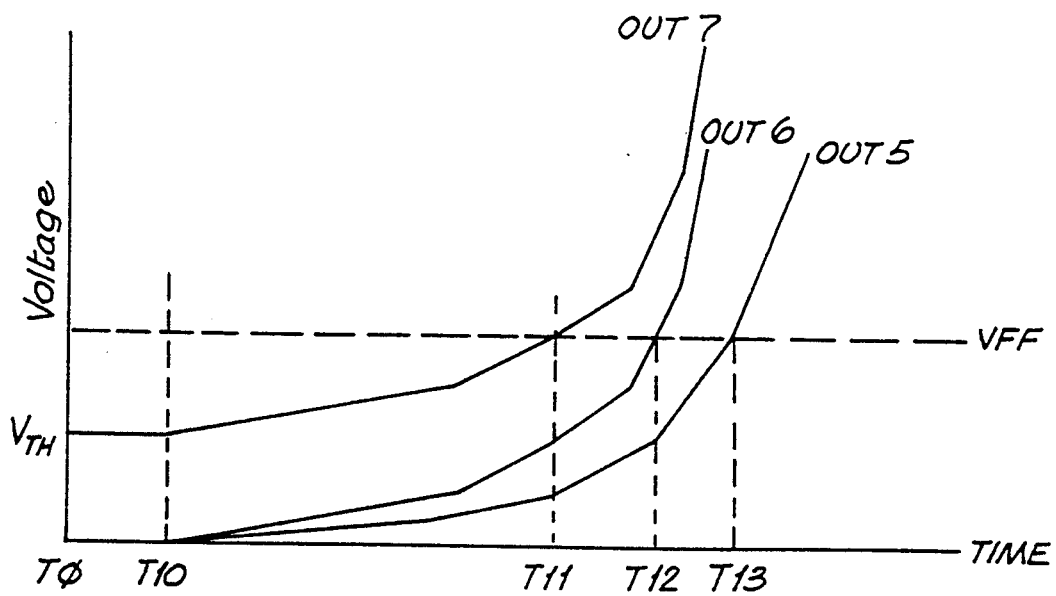

HIGH SPEED THRESHOLD CROSSING DETECTOR WITH RESET

BACKGROUND OF THE INVENTION

1. Field of the Invention

This invention relates to the field of high-speed comparator circuits.

2. Background Art

In data recovery circuits, phase lock loops are utilized to lock onto timing pulses encoded in the data to be recovered to facilitate synchronized data extraction. An integral part of the phase lock loop is a voltage-controlled oscillator (VCO). The linear response of the VCO is a requirement for a stable phase lock loop.

In an all-CMOS VCO implementation, it is difficult to achieve a linear response at high frequency operation. The non-linearity at high frequency is caused by intrinsic delays within the circuit. An all-CMOS VCO is described in the copending U.S. patent application Ser. No. 07/960,534, filed Oct. 13, 1992, assigned to the present assignee, entitled "Linearized and Delay Compensated All-CMOS VCO." A block diagram of an all-CMOS VCO is illustrated in FIG. 1.

Transconductance converter block 101 receives control voltage Vin 100 and provides control currents 113 and 130. These currents are proportional to the control voltage Vin. Control current (I) 130 is provided to VCO core block 202. VCO core block 202 has two output nodes, 217 and 218, that are coupled to a positive voltage supply through capacitors 203 and 204, respectively. Nodes 217 and 218 alternate between two operational states with one node being in a first state while the other node is in the second state. In the first operational state, the output node is charged to the positive voltage supply value and maintains that value until the operational state has changed. In the second operational state, the output node ramps down from the positive voltage supply value at a rate determined by control current 130 (I), until a change of state is triggered. VCO core 202 receives clk+input 215 and clk−input 216 to control the state switching of the output nodes 217 and 218. Output nodes 217 and 218 are coupled to the negative input of comparators 205 and 206, respectively. A trip voltage is provided to the positive inputs of comparators 205 and 206 on line 225. Comparators 205 and 206 are coupled to the "set" and "reset" inputs, respectively, of set/reset flip-flop 207. S-R flip-flop (latch) 207 provides Q and Q* outputs which represent clk+215 and clk−216 output signals, respectively. Signals 215 and 216 represent the oscillating output of the voltage-controlled oscillator system.

When node 217 is in the ramp down state and reaches the trip voltage value, comparator 205 outputs a high pulse to the set input of latch 207. This causes the output of latch 207 (Q, Q*), to change states from (0, 1) to (1, 0). The clk+ and clk− signals then cause the VCO core 202 to switch the operational states of output nodes 217 and 218. When node 218 ramps down past the trip voltage value, comparator 206 triggers the reset input of latch 207 and causes the output to change state from (1, 0) to (0, 1) causing clk+ and clk− to trigger another cycle.

The half cycle of this VCO block is ideally the time it takes for the ramp voltage to drop from the positive voltage supply value to the trip voltage value. However, once the ramp voltage crosses the trip voltage value, the ramp voltage continues to drop until the comparator and latch can switch the VCO core. Thus, the half cycle of the VCO is the sum of the ramp down time plus the comparator/latch delay. Therefore, the frequency response of this VCO circuit (without the compensation loop) is:

$$F_{OUT} = \frac{1}{2(CV/I + delv)}$$

where V is the potential difference between the supply voltage and the trip voltage values, C is the capacitance of capacitors 203 and 204, I is control current 130, and delv is the comparator/latch delay. Thus, the delay of the comparator and latch introduce non-linearity to the frequency-versus-voltage response at high frequencies where the ideal half cycle term CV/I is of the same order of magnitude as the comparator/latch delay delv.

A graph illustrating the frequency versus voltage characteristics of the VCO is illustrated in FIG. 2. The solid line represents the ideal frequency response of the VCO in which the frequency is only a function of the ramp down time of the VCO core ($F_{OUT}=1/(2T_H)$). The dashed curve is the uncompensated output of the VCO, which flattens out toward the dashed limit line that is equivalent to $F_{OUT}=1/(2\ delv)$. A phase lock loop, utilizing a VCO with the frequency response described by the dashed curve, cannot be analyzed and may be unstable and/or unable to lock in phase to i this reason, it is desired to minimize the effect of the comparator/latch delay in the VCO circuit.

A prior art CMOS comparator is disclosed in "A 30 MHz Low-Jitter, High-Linearity CMOS Voltage-Controlled Oscillator," by Wakayama and Abidi in the *IEEE Journal of Solid State Electronics*, Vol. SC-22, No. 6, December, 1987, pp. 1074–1080. The comparator of Wakayama, et al., is illustrated in FIG. 3.

A PMOS transistor M5 is coupled between a positive voltage supply and node 300, with its gate coupled to a negative voltage supply. PMOS transistor M1 is coupled between node 300 and the negative voltage supply, with its gate acting as the positive input terminal 304. PMOS transistor M2 is coupled between node 300 and output node 303, with its gate acting as negative input terminal 306. NMOS transistor M4 is coupled between output node 303 and the negative supply voltage, with its gate coupled to high-impedance node HIZ 302. NMOS transistor M3 is coupled between high impedance node 302 and the negative voltage supply, with its gate coupled to output node 303. NMOS transistor M6 is coupled between output node 303 and the negative voltage supply, with its gate acting as a reset RST input 301.

The comparator of FIG. 3 is referred to as a "positive feedback" comparator. Transistors M3 and M4 are cross-coupled, and therefore transistor M4 should not be strongly turned on. HIZ 302 should have enough voltage to allow transistor M4 to sink one-half the current flowing through transistor M1 when transistor M2 is off. As IN− voltage crosses the IN+ voltage, the current passing through transistor M2 becomes larger than the current passing through transistor M4, the voltage at output node OUT 303 begins to rise and transistor M3 turns on. HIZ node 302 is pulled low via transistor M3, and transistor M4 begins to shut down. The positive feedback takes over and OUT 303 node latches high. The voltage vs. time characteristics of this circuit are shown in FIG. 4.

Lines 410 and 411 on FIG. 4(A) illustrate voltage vs. time characteristics of IN+ and IN− as would occur if this comparator were used in the VCO described above. IN+ represents a stable reference voltage and IN− represents the ramping voltage. IN+ is constant at a voltage VTRIP. Prior to time T1, IN− is stable at a voltage VPOS. At time T1, IN− begins to ramp downwards at a constant rate. At time T2, IN− crosses IN+. At time T6, IN− is charged back up to voltage VPOS.

Lines 412 and 413 of FIG. 4(B) illustrate the voltage vs. time characteristics for HIZ input node 302 and output node 303. Prior to time T3, HIZ node 302 maintains a constant voltage VBIAS generated by external circuitry, and OUT node 303 maintains a voltage consistent with the negative voltage supply value. At time T3, triggered by the crossing of IN− under IN+, OUT begins to rise toward VPOS and transistor M3 begins to turn on pulling HIZ 302 toward the negative voltage supply value. At time T4, HIZ input 302 has been pulled to the negative voltage supply value and transistor M4 has been turned off, causing the output voltage at OUT node 303 to charge rapidly up to VPOS, which it reaches at time T5. At time T6, when IN− crosses back over IN+, the voltage at output node 303 remains at the voltage VPOS because the positive feedback maintains transistor M4 in a high impedance state. At time T7, reset signal RST 301 is asserted by external circuitry (line 414 of FIG. 4(C)). With signal RST asserted, transistor M6 becomes a low impedance path between the output node 303 and the negative voltage supply, thus discharging output node 303. As the output voltage drops toward the negative voltage supply, the impedance of transistor M3 begins to increase, allowing the voltage at HIZ node 302 to increase toward VBIAS. At time T8, reset signal RST achieves its maximum amplitude and output node 303 is completely discharged to the negative voltage supply. This causes transistor M3 to shut off completely, increasing the rate at which HIZ node 302 rises toward VBIAS. At time T9, HIZ node 302 achieves the voltage VBIAS.

There are disadvantages of the comparator design of FIG. 3. For example, VBIAS for high impedance node HIZ 302, must have just enough voltage to enable transistor M4 to sink one-half the current flowing through transistor M1 when transistor M2 is off. Otherwise, if the voltage at HIZ is too large, transistor M4 conducts more current and the circuit will be unbalanced. In other words, for transistor M2 to conduct enough current to begin charging up the output node, IN− will have to be higher than IN+ by an offset voltage determined by the VBIAS offset. If the voltage at HIZ is too low, then the current conducted through transistor M4 will be less and the comparator will begin to switch states when IN− is at a voltage higher than IN+ by a voltage offset determined by the voltage error at HIZ. The comparator is unbalanced if the proper voltage is not maintained.

Secondly, HIZ must be a very high impedance. In fact, to transistor M3, node HIZ must appear to be an open circuit. However, the voltage on HIZ must not drift while transistor M3 is off.

Thirdly, HIZ must have a low capacitance. If the capacitance at node HIZ is high, transistor M3 will take longer to pull HIZ low, thus reducing the effectiveness of the positive feedback in the circuit to shorten the rise time of the comparator output.

Further, the HIZ node must be isolated from signal noise. Since HIZ is a high impedance node, its susceptibility to noise pick-up is very high. Noise on HIZ also affects the offset of this comparator.

Generating the proper HIZ voltage (VBIAS) with a high output impedance and low capacitance, requires a significant amount of circuitry and consumes a significant amount of area on the integrated circuit chip. The HIZ node must also be isolated from noisy signals, thus adding additional constraints on the design.

One technique to minimize the effect of the comparator/latch delay is described in co-pending U.S. patent application Ser. No. 07/960,534, entitled "Linearized and Delay-Compensated All-CMOS VCO", and assigned to the present assignee. This technique utilizes the compensation loop illustrated in FIG. 1.

VCO core block 208 receives control current I on line 113 and clk+ and clk− signals. Outputs 229 and 230 of VCO core 208 are coupled to the positive voltage supply through capacitors 227 and 228. VCO core 208 operates in a similar manner to VCO core 202, thus generating voltage signals at output nodes 229 and 230, which mirror the voltages at nodes 217 and 218, respectively. Track-and-hold circuits 219 and 220 are coupled to output nodes 229 and 230 and also receive, as control signals, clk+ and clk− signals, respectively. These track-and-hold circuits track the voltage at the respective input nodes during the "track" operational state, and then hold the peak voltage value (ramp down minimum value), supplying this peak value to node 212 for the duration of the "hold" operational state. Due to switching circuitry within the track-and-hold circuits, circuits 219 and 220 are only coupled to node 212 while they are in their respective "hold" states. Node 212 provides the held peak value to the negative input of difference amplifier 211 through low-pass filter 210. The difference amplifier 211 compares the filtered peak values with an externally provided reference voltage 224 to generate the trip voltage signal on wire 225. Thus, a compensation loop is formed. The compensation loop alters the trip voltage in such a way that the voltage difference V between the positive voltage supply value and the trip voltage is decreased as the operating frequency increases. Thus, the voltage overshoot of the VCO core caused by the comparator/latch delay is compensated with a corresponding change in the trip voltage. The frequency response of this compensated circuit is:

$$F_{OUT} = \frac{1}{2[CV/I + delv/(N+1)]}$$

where N is the gain of difference amplifier 211 and V' is the difference between the supply voltage value and the reference voltage. For a gain of N=10, the linear region of the compensated circuit can be increased by as much as a factor of 11 (depending on method of measurement). This greatly increases the range of the VCO. However, as the altered trip voltage rises closer to the voltage supply value, the noise immunity of the circuit is diminished. Thus, for higher frequency operation, this compensated circuit may experience phase jitter generated by noise from the voltage supply.

SUMMARY OF THE PRESENT INVENTION

The present invention provides a high speed, all CMOS comparator utilizing positive feedback and DC voltage clamping. The circuit comprises two source-coupled PMOS transistors with their sources coupled to a current source or a supply voltage. The gate of the first PMOS transistor represents the positive voltage input terminal, and the gate of the second PMOS transistor represents the negative voltage input terminal. The output of the circuit is taken from the drain of the second PMOS transistor. The drain of the second PMOS transistor is further coupled to one terminal of a current mirror. A third PMOS transistor is coupled between the drain of the first PMOS transistor and a second terminal of the current mirror.

The gate of this third PMOS transistor is coupled to the output node in such a way as to provide positive feedback to the circuit. As the negative input voltage becomes lower than the positive input voltage, the current passing through the second PMOS transistor increases and the current passing through the first PMOS transistor will decrease. The differential current between the second and first PMOS transistors acts to charge the output node. As the output node increases in voltage, the equivalent resistance of the third PMOS transistor increases, thus decreasing the current through the first PMOS transistor. This acts to increase the current being provided to the output node and increases the drive characteristics of the circuit.

As a further improvement to the circuit, a voltage-clamping device is included in the design. The drain and gate of an NMOS transistor are coupled to the sources of the current mirror, and the source of the NMOS transistor is coupled to the negative power supply. The addition of this NMOS transistor serves to prevent the output voltage from falling below $V_{TH}$, the threshold voltage of the NMOS transistor, thereby reducing the voltage excursion required by the output and thus, the rise time of the output. A reset means is provided to pull the output low.

BRIEF DESCRIPTION OF THE DRAWINGS

FIG. 7 illustrates a circuit diagram of one possible embodiment of the present invention.

FIG. 8 is a graph of the output characteristics of the circuits of FIGS. 5, 6 and 7.

DETAILED DESCRIPTION OF THE PRESENT INVENTION

A CMOS, high-speed threshold crossing detector is described. In the following description, numerous specific details are set forth to provide a more thorough understanding of the present invention. It will be obvious, however, to one skilled in the art, that the present invention may be practiced without these specific details. In other instances, well known circuits have not been described so as not to obscure the present invention.

Figure 5:
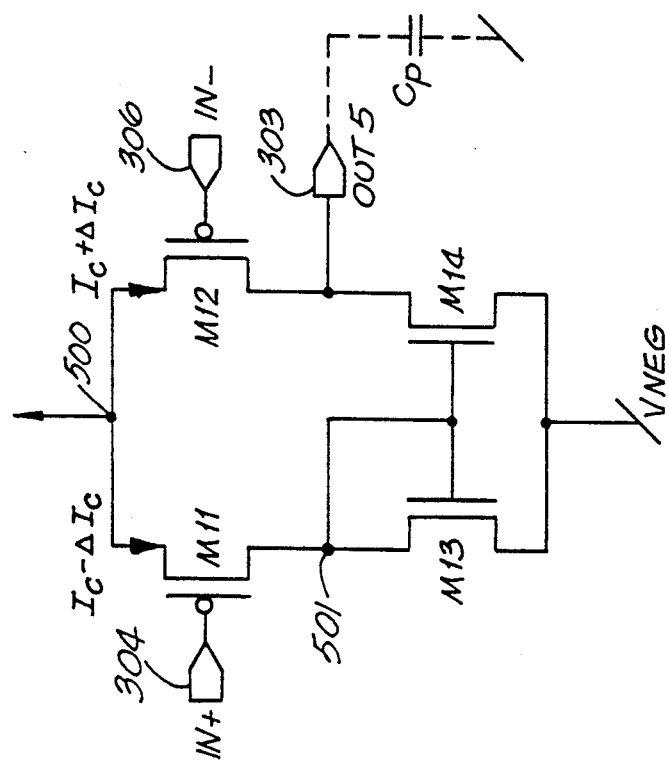
FIG. 5 illustrates a circuit diagram of a 4-transistor comparator.

The comparator circuit of the present invention utilizes positive feedback to decrease the rise time of the output voltage. However, it does not require the complex circuitry necessary to provide a high impedance node as is required in the prior art. A 4-transistor comparator circuit is shown in FIG. 5.

PMOS transistor M11 is coupled between nodes 500 and 501, with its gate acting as positive input terminal IN+ 304. PMOS Transistor M12 is coupled between output node 303 and node 500, with its gate acting as negative input terminal IN− 306. NMOS transistor M13 is coupled between node 501 and a negative voltage supply. NMOS transistor M14 is coupled between output node 303 and the negative voltage supply. The gates of transistors M13 and M14 are coupled together to node 501, forming a current mirror. Node 500 is coupled either to a current source or to a positive supply voltage. (With node 500 coupled to a current source, the current is limited and thus the power dissipated in the circuit is limited, therefore making the circuit usable in low-power applications). Output signal OUT 5 is taken from output node 303.

The operation of the comparator is as follows. The current mirror comprised of transistors M13 and M14 sets up the condition that the current flowing from node 501 to the negative voltage supply is equivalent to the current flowing from output node 303 to the negative voltage supply. Considering the case where IN+ is at a greater voltage than IN−, and assuming that a current 2 $I_C$ is being provided to node 500, transistor M11 will be conducting a current $I_C$ minus a certain amount of current $\Delta I_C$, and transistor M12 will be conducting a current $I_C$ plus an amount of current $\Delta I_C$. Because transistor M13 is only conducting $I_C - \Delta I_C$ and transistor M14 must be conducting an equivalent current $I_C - \Delta I_C$, a net current equal to $2\Delta I_C$ is left at node 303 to charge up the parasitic capacitance $C_P$, increasing the voltage at OUT 5 until the circuit saturates. For the opposite case where IN+ is lower in potential than IN−, the net current at node 303 is $-2\Delta I_C$ which discharges the parasitic capacitance and decreases the voltage signal OUT 5 down to the negative supply value.

Figure 6:
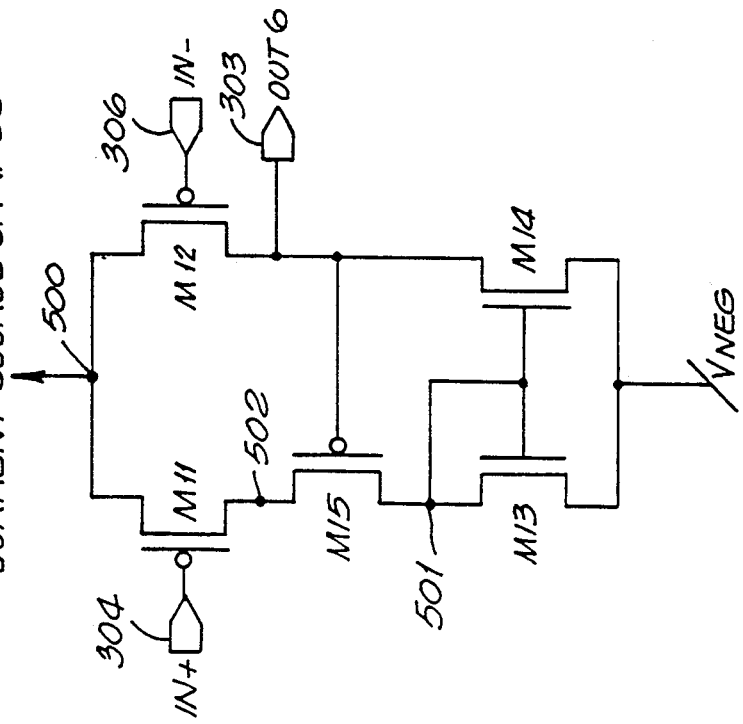
FIG. 6 illustrates a circuit diagram of a comparator incorporating the feedback means of the present invention.

FIG. 6 illustrates a comparator with the addition of the feedback means of the present invention. The circuit of FIG. 6 is similar to the circuit of FIG. 5, however, it has the additional feature of PMOS transistor M15 coupled between node 501 and transistor M11 at node 502. The gate of transistor M15 is coupled to output node 303 to provide positive feedback. This positive feedback does not reduce the intrinsic delay of the comparator. However, it does improve the output voltage level or rise time of the comparator. The circuit including transistor M15 responds faster than the simple comparator for the same input drive voltage. Thus, the total delay of the circuit is less than for the circuit of FIG. 5.

The effect of the positive feedback through transistor M15 is to shut down transistors M13 and M14 as transistor M12 starts to drive the output node 303 high. The current that would otherwise pass through transistor M14 is instead used to drive the output node 303 high, thus, the voltage of OUT 6 rises faster than OUT 5. Transistor M15 cannot respond until transistor M12 begins to conduct, thus, the intrinsic delay of the new circuit is the same as the 4-transistor comparator.

When the positive feedback is activated and shuts down the transistor M14, the effective drive of transistor M12 on output node 303 is increased substantially. Thus, the circuit of FIG. 6 has a better dynamic drive characteristic than the standard comparator design of FIG. 5 and it can drive a larger load on its output. The result is a faster comparator.

The advantage of the higher drive capability also means that the circuit which follows the comparator can be larger because the stronger output drive can be used to reduce the effect of loading on the output of the comparator. Thus, the advantage of the positive feedback can be used in two ways. (1) The increased drive decreases the rise time of the output for the same parasitic capacitance, or (2) the increased output drive can be utilized to drive a larger circuit which can itself, by virtue of its increased size, have a decreased response time.

FIG. 7 shows the circuit of FIG. 6 with the addition of NMOS transistor M16. NMOS transistor M16 is coupled between transistor M14 and output node 303. The gate of transistor M16 is also coupled to output node 303. The effect of transistor M16 on the circuit is to prevent the output voltage from falling below a set voltage, the transistor's gate-source threshold voltage. Transistor M16 acts as a DC clamp, such that OUT 7 starts at a higher output voltage and, in effect, M16 reduces the time needed to reach the threshold voltage for the circuit which follows the comparator. Other means for DC clamping can be utilized in this circuit. However, as the starting output voltage of the comparator becomes closer to the threshold voltage of the following circuit, noise immunity decreases. A drain-gate coupled NMOS transistor provides a DC clamp equal to the gate-source threshold voltage of the transistor. This DC clamp value is large enough to provide a significant decrease in circuit rise time, and yet provides for sufficient noise immunity with a minimum number of components.

FIG. 8 illustrates the voltage vs. time characteristics of output signals OUT 5, OUT 6 and OUT 7 (the outputs of FIG. 5, FIG. 6 and FIG. 7, respectively). T0 represents the time at which signal IN− crosses under the voltage signal IN+. VFF represents the threshold voltage of the circuitry following the comparator (a flipflop in the case of the VCO earlier described). $V_{TH}$ corresponds to the gate-source threshold voltage of an NMOS transistor. From time T0 to time T10, all of the output signals maintain a constant voltage. This time period corresponds to the intrinsic delay of the comparator circuit, or the time it takes for transistor M12 to recover from the "off" state and begin conducting current. Output signal OUT 5 begins rising at time T10 and crosses threshold voltage VFF at time T13. Output signal OUT 6 begins rising at time T10 and due to the positive feedback, crosses threshold voltage VFF at time T12 ahead of output signal OUT 5. Output signal OUT 7 begins rising at time T10 from the clamp voltage $V_{TH}$, rising at the same rate as output OUT 6 with the DC offset $V_{TH}$, and crosses threshold voltage VFF at time T11 well in advance of time T12 or T13. With the circuit of FIG. 6 utilized in the VCO previously discussed, frequency range is increased.

Due to the placement of transistor M16 on one leg of the differential pair of transistors made up of M11 and M12, the circuit of FIG. 7 experiences an input offset such that the output does not change states until IN−− crosses under IN+ by the input offset. This is because the comparator is no longer balanced.

Figure 9:
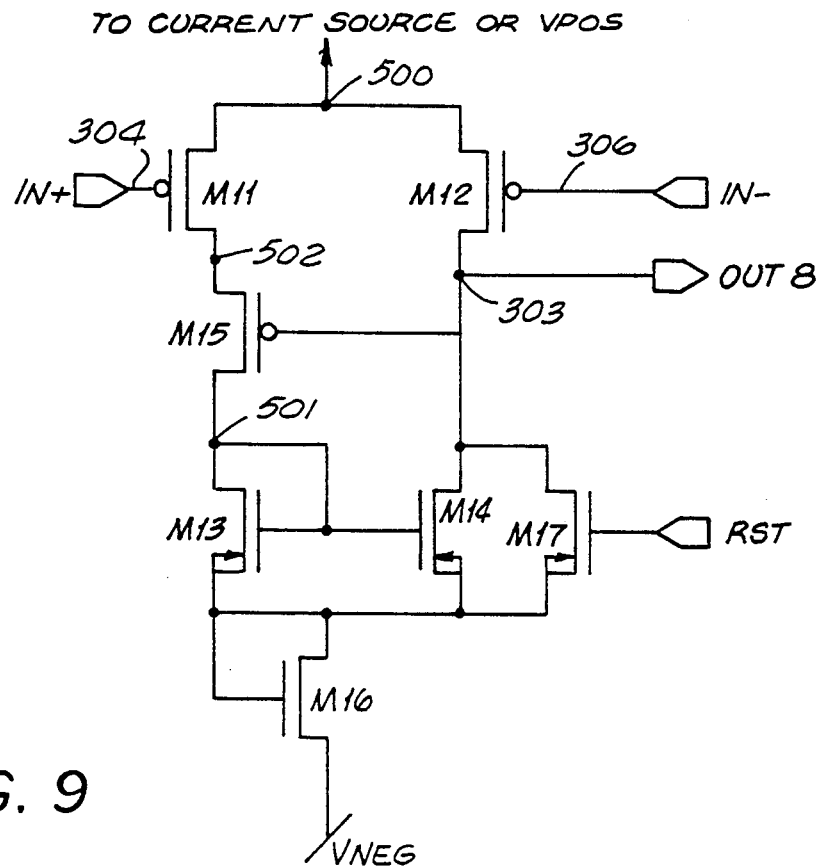
FIG. 9 is a circuit diagram of the preferred embodiment of the present invention.

The preferred embodiment of the present invention illustrated in FIG. 9 places transistor M16 between the coupled sources of the current mirror M13-M14 and the negative voltage supply. The effect is that transistor M16 still generates the necessary DC clamp, but also eliminates the offset of the clamp. Also shown in FIG. 9 is NMOS transistor M17 coupled in parallel with transistor M14. This transistor is responsible for resetting the circuit after the output has gone high. This reset means allows for a "hand-shaking" scheme in which the circuit following the comparator serves to reset the comparator after the change of state has been successfully detected. Reset transistors are not shown in the previous figures, however, the appropriate positions for a reset transistor in FIG. 7 is either in parallel with transistor M16 or coupled between the output node 303 and the negative supply voltage.

The preferred embodiment of the present invention is simpler in topology than the prior art approach, which required a high-impedance node for the comparator. The circuit is not only less complex, it also lends itself to a smaller circuit layout and requires only two additional components (not including reset) over the simple minded 4-transistor comparator.

The resetting signal for the comparator also acts as an acknowledgement from the circuit that follows the comparator. This mechanism improves the overall reliability of the circuit. The positive feedback of the latching action within the comparator, and the required resetting of it by the circuit that follows it, guarantees that no false detection or partial detection of a threshold crossing can be made. In a simple minded comparator, false or partial detection is possible.

Thus, a high-speed all-CMOS threshold-crossing detector has been described. The circuit as described can also be implemented by inverting the polarities of the elements in the circuits and by replacing PMOS transistors with NMOS transistors, and vice versa. Further, feedback transistor M15 and DC clamp transistor M16 can be used in the comparator circuit either singly or in combination to achieve an improved time response over the prior art. The present invention is not limited to use in a VCO. It can be utilized in any circuit requiring an all-CMOS comparator.

For example, another use for the high-speed comparator of the present invention is in a write precompensation circuit. A variable timer delay scheme is used in a write precompensation circuit to pre-distort signals which would otherwise be subject to intersymbol interference due to their proximity to each other in a magnetic recording environment. The variable timer delay allows for the signals to be separated by a time delay in a controllable manner. This variable timer delay circuit comprises a one-shot circuit utilizing a threshold crossing detector. An example of a timer delay circuit is shown in FIG. 10.

Figure 10:
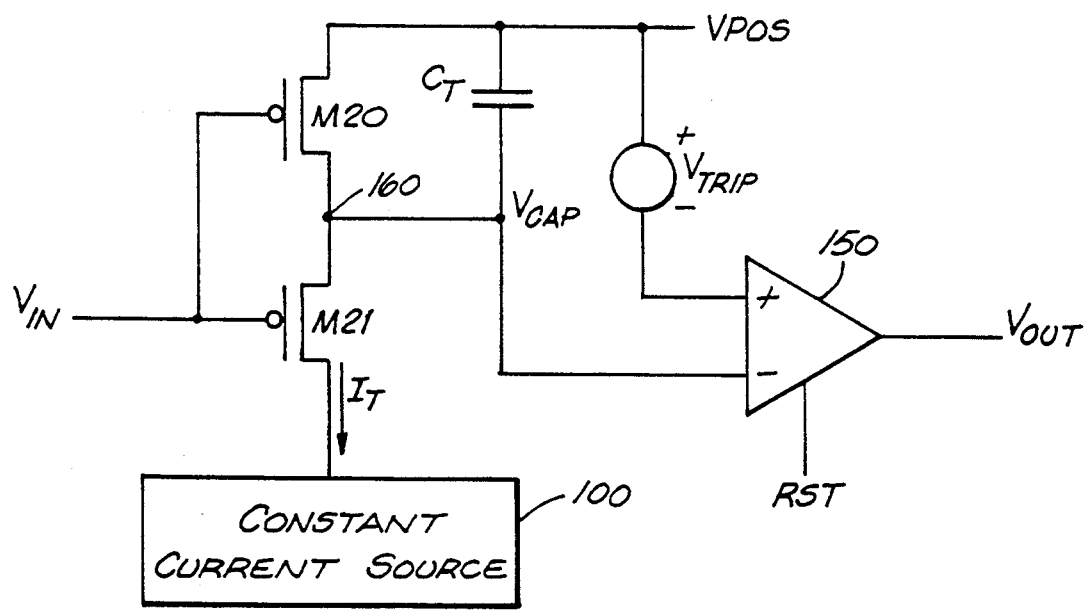
FIG. 10 is a block diagram of a variable timer delay utilizing the threshold crossing detector of the present invention.

In FIG. 10, PMOS transistor M20 is coupled between positive voltage supply VPOS and node 160. NMOS transistor M21 is coupled between node 160 and a constant current source 100, which supplies constant current $I_T$. The gates of transistors M20 and M21 are coupled to input pulse $V_{IN}$. Timing capacitor $C_T$ is coupled between node 160 and positive voltage supply VPOS. Comparator 150, comprising the design of the present invention, has negative input coupled to node 160 and its positive input coupled to a voltage reference value $V_{TRIP}$. The output of comparator 150 is the output signal $V_{OUT}$.

In the timer delay circuit, when $V_{IN}$ is low, transistor M20 provides a low impedance path to increase the voltage at node $V_{CAP}$ which is coupled to capacitor $C_T$ to the positive voltage supply value. At the same time, transistor M21 is in a high impedance state. Since the negative input of comparator 150 is at the positive voltage supply value and the positive input of the comparator is at the reference value, the output $V_{OUT}$ is at its low value. When $V_{IN}$ switches to a high state, transistor M20 shuts off and transistor M21 becomes a low impedance path conducting constant current $I_T$ away from node 160. Thus the voltage at node $V_{CAP}$, which is coupled to capacitor $C_T$, is reduced at a constant rate. When $V_{CAP}$ crosses under $V_{TRIP}$, comparator 150 outputs a high value. The timing delay of this circuit takes effect on the rising edge of the input pulse. The delay is described by the equation:

$$T_{del} = \frac{V_{TRIP} C_T}{I_T} + T_{COMP}$$

where $T_{del}$ is equal to the total timing delay and $T_{COMP}$ is equal to the comparator delay. To be useful, the total delay should not be too large. Therefore, a minimized $T_{COMP}$ is desired. For an all CMOS circuit requiring a CMOS comparator, the comparator of the present invention provides an acceptable all-CMOS solution where other CMOS comparators are too slow. A method for improving the characteristics of the left half of the equation, $V_{TRIP}C_T/I_T$, is described in copending United States patent application Ser. No. 07/780153 entitled, "Frequency and Capacitor Based Constant Current Source," filed Oct. 21, 1991 and assigned to the present assignee.

Figure 1:
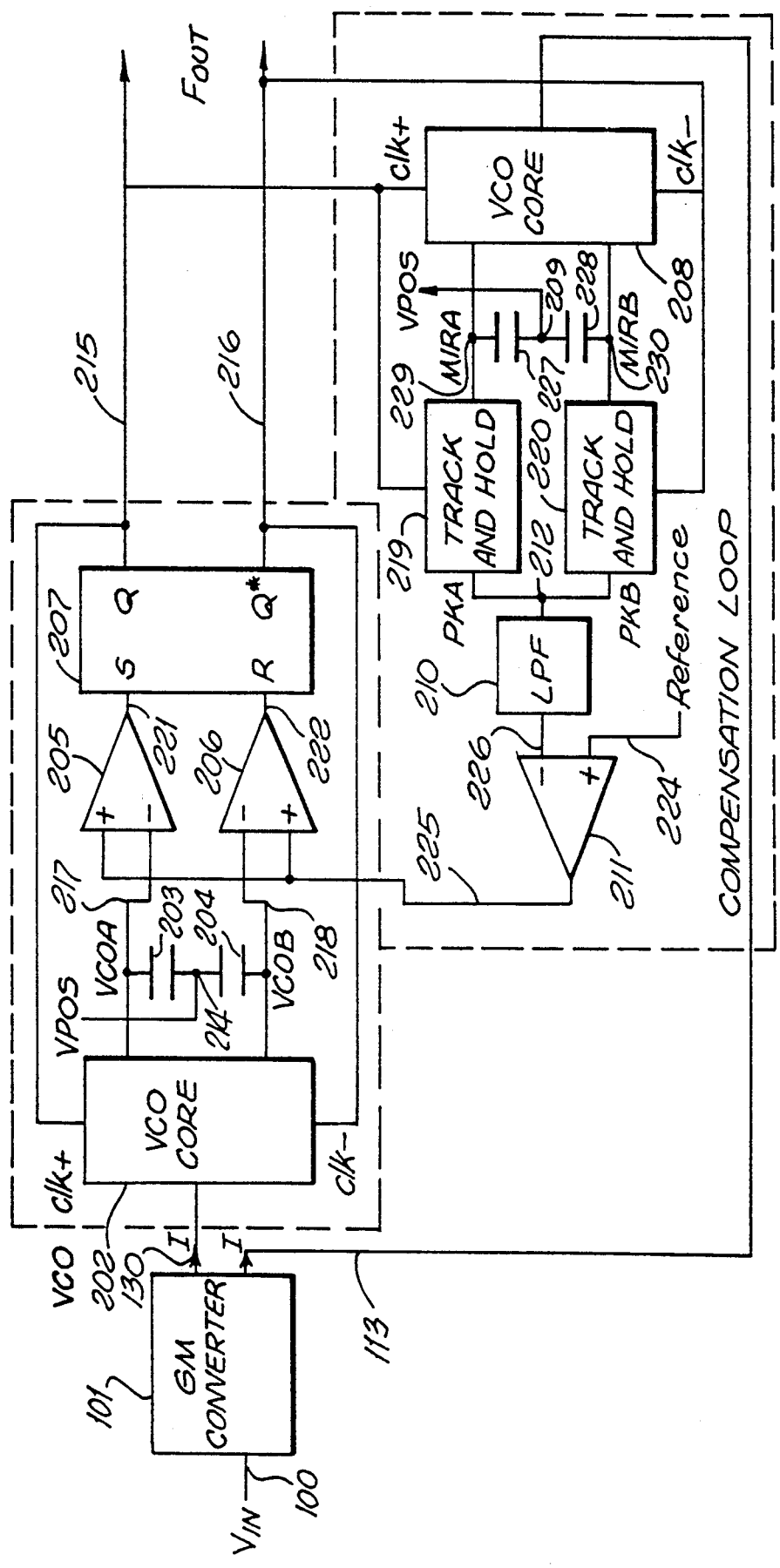
FIG. 1 illustrates a voltage-controlled oscillator configuration in which the threshold crossing detector of the present invention may be implemented.
Figure 2:
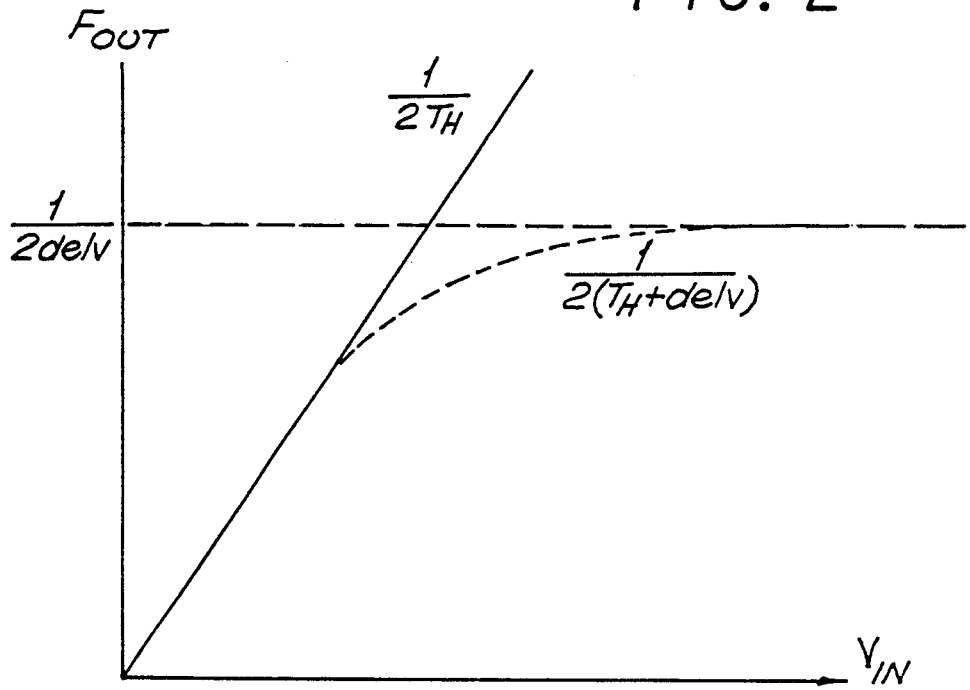
FIG. 2 is a graph depicting the frequency-versus-voltage response of a CMOS VCO.
Figure 11:
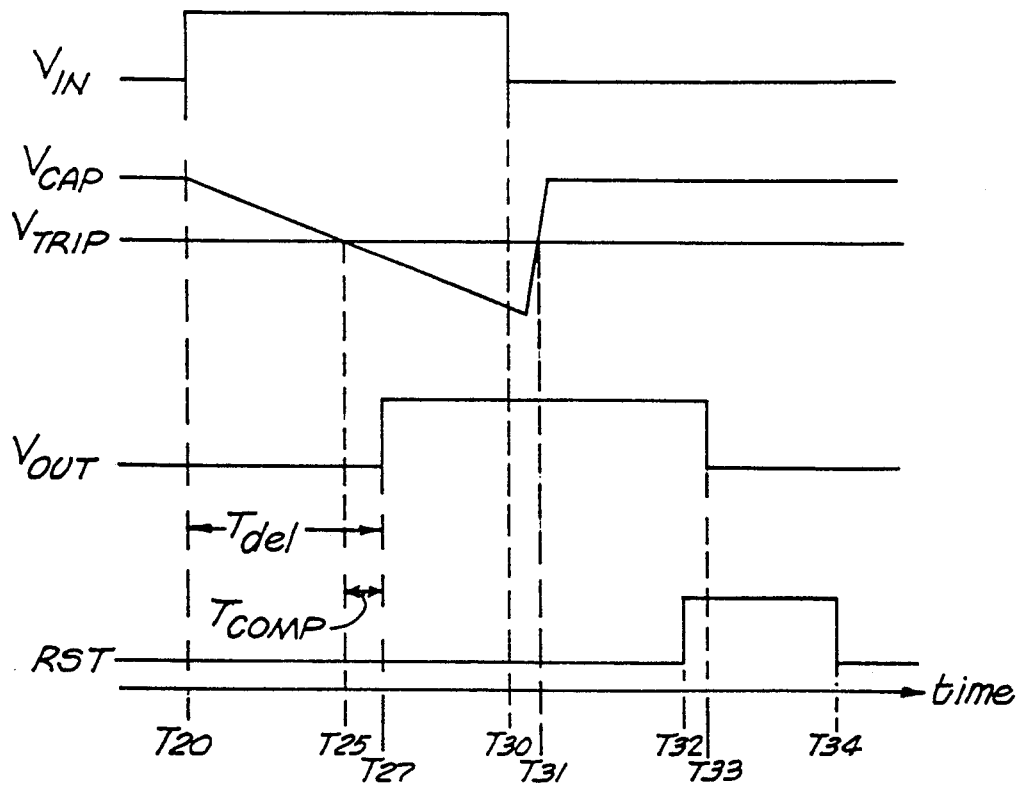
FIG. 11 illustrates the timing characteristics of the variable timer delay of FIG. 10.
Figure 4A:
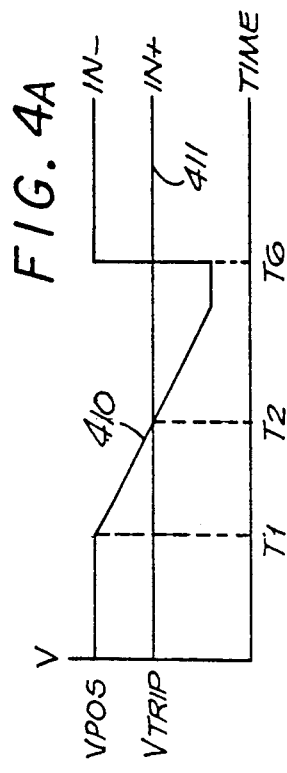
FIGS. 4A–C illustrate timing diagrams for the circuit of FIG. 3.
Figure 4B:
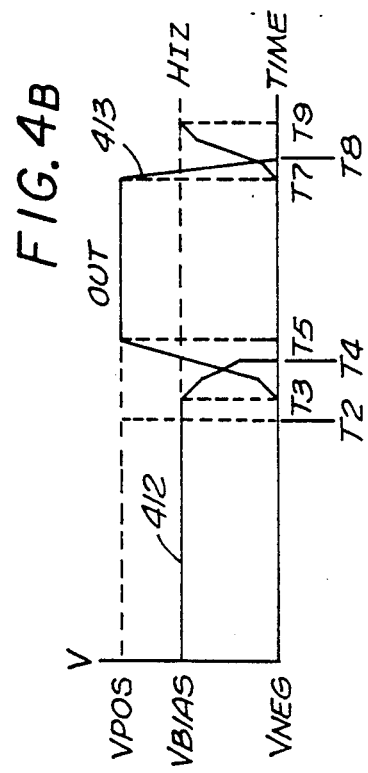
Figure 4C:
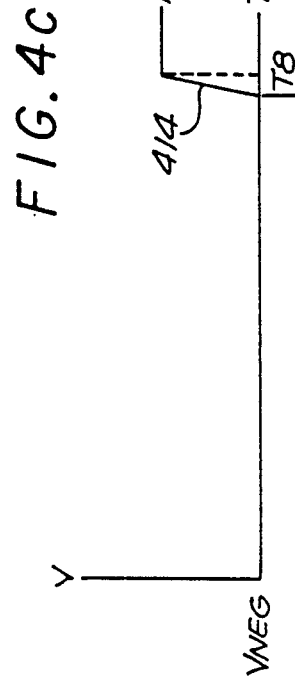
Figure 3:
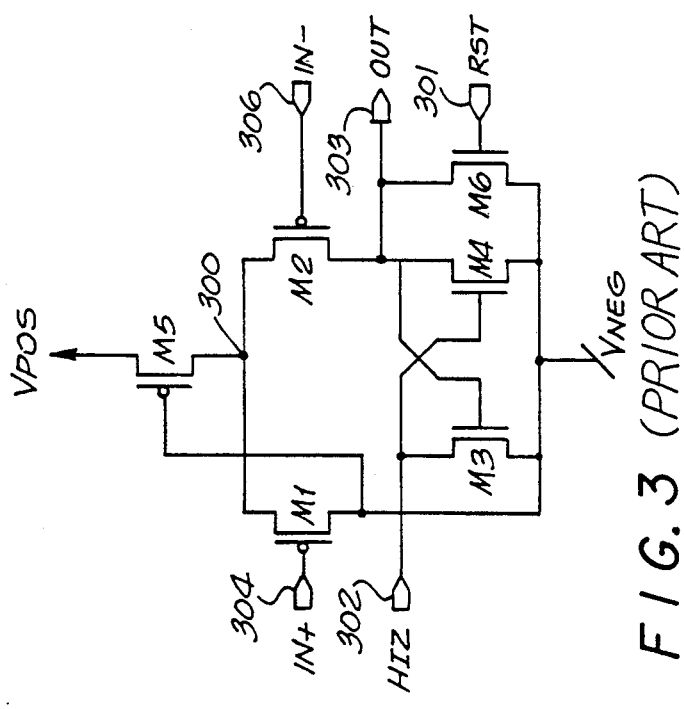
FIG. 3 illustrates a circuit diagram of a prior art CMOS comparator.

The voltage vs. time characteristics for the timer delay circuit are illustrated in FIG. 11. At time T20, the rising edge of an input pulse at $V_{IN}$ causes capacitor $C_T$ to begin discharging at a constant rate, as shown by downward ramping voltage signal, $V_{CAP}$. At time T25, $V_{CAP}$ crosses voltage signal $V_{TRIP}$. The period from T20 to T25 constitutes the ideal delay, $V_{TRIP}C_T/I_T$. $V_{TRIP}$ remains constant throughout the pulse but in actuality can be altered to change the ideal delay. At time T27, the output, $V_{OUT}$, of the comparator is pulled to its high value. The time period from T25 to T27 constitutes the delay of the comparator, $T_{COMP}$. Thus, the time period from T20 to T27 forms the total delay, $T_{del}$. For a useful circuit, the time delay T27-T25 should be minimized.

The falling edge of the input pulse on $V_{IN}$ occurs at time T30, and serves to shut off the discharge path of capacitor $C_T$ while opening a low impedance path to the positive voltage supply. Therefore, voltage signal $V_{CAP}$ rises quickly towards the positive supply value. At time T31, $V_{CAP}$ crosses back over $V_{TRIP}$. Due to the positive feedback design of the comparator, $V_{OUT}$ will remain in its high state until the comparator is reset by some external circuit. The rising edge of the reset signal RST in FIG. 11 occurs at time T32. At time T33, the output signal $V_{OUT}$ returns to its low state. The time period from T32 to T33 is greater than zero, but out necessarily equal to $T_{COMP}$. The falling edge of RST occurs at T34. For the circuit to function correctly, T32 must occur after T27, otherwise the output pulse will not be generated. Also, T34 must occur after T31, otherwise the comparator will not reset. The comparator of the present invention allows for the delay circuit to operate at frequencies useful in a precompensation circuit.

I claim:

1. A circuit comprising:
   first input means receiving a first voltage input signal, said first input means coupled to a first node;
   second input means receiving a second voltage input, said second input means coupled to said first node and to an output node;
   current mirror means coupled to a first voltage supply and to said second input means at said output node, said current mirror means receiving a first current and generating a second current equivalent to said first current;
   positive feedback means coupled to said first input means and said current mirror means, said positive feedback means controlled by an output voltage at said output node.

2. The circuit of claim 1 further including a DC clamping means coupled between said output node and said current mirror means, said DC clamping means increasing a minimum output voltage level.

3. The circuit of claim 1 further including a reset means coupled to said output node.

4. The circuit of claim 1 further including a DC clamping means coupled between said current mirror means and said first voltage supply, said DC clamping means increasing a minimum output voltage level.

5. The circuit of claim 1 further including a second voltage supply coupled to said first node.

6. The circuit of claim 1 further including a current source coupled to said first node.

7. The circuit of claim 1 wherein said first input means, said second input means and said positive feedback means comprise transistors of a first type, and said current mirror means comprise transistors of a second type.

8. A circuit comprising:
   first input means receiving a first voltage input signal, said first input means coupled to a first node;
   second input means receiving a second voltage input, said second input means coupled to said first node and to an output node;
   current mirror means coupled to a first voltage supply, to said first input means, and to said second input means, said current mirror means receiving a first current and generating a second current equivalent to said first current;
   DC clamping means coupled to said current mirror means increasing a minimum output voltage level.

9. The circuit of claim 8 further including positive feedback means coupled to said first input means and said current mirror means, said positive feedback means controlled by an output voltage at said output node.

10. The circuit of claim 8 wherein said DC clamp means is coupled between said output node and said current mirror means.

11. The circuit of claim 8 further including a reset means coupled to said output node.

12. The circuit of claim 8 wherein said DC clamping means is coupled between said current mirror means and said first voltage supply.

13. The circuit of claim 8 further including a second voltage supply coupled to said first node.

14. The circuit of claim 8 further including a current source coupled to said first node.

15. The circuit of claim 8 wherein said first input means and said second input means comprise transistors of a first type, and said current mirror means and said DC clamping means comprise transistors of a second type.

16. A circuit comprising:
first input means receiving a first voltage input signal, said first input means coupled to a first node;
second input means receiving a second voltage input, said second input means coupled to said first node and to an output node;
current mirror means coupled to a first voltage supply and to said second input means at said output node, said current mirror means receiving a first current and generating a second current equivalent to said first current,
positive feedback means coupled to said first input means and said current mirror means, said positive feedback means controlled by an output voltage at said output node;
DC clamping means coupled to said current mirror means increasing a minimum output voltage level.

17. The circuit of claim 16 wherein said DC clamp means is coupled between said output node and said current mirror means.

18. The circuit of claim 16 further including a reset means coupled to said output node.

19. The circuit of claim 16 wherein said DC clamping means is coupled between said current mirror means and said first voltage supply.

20. The circuit of claim 16 further including a second voltage supply coupled to said first node.

21. The circuit of claim 16 further including a current source coupled to said first node.

22. The circuit of claim 16 wherein said first input means, said second input means, and said positive feedback means comprise transistors of a first type, and said current mirror means and said DC clamping means comprise transistors of a second type.

23. A variable timer delay circuit comprising:
first and second drain-coupled MOS transistors of different channel types receiving a voltage input, said first transistor source-coupled to a voltage supply, said second transistor source coupled to a constant current source;
a capacitor coupled to the drains of said first and second transistors and to said voltage supply;
threshold crossing detector having first input means coupled to a threshold voltage and second input means coupled to said capacitor, said threshold crossing detector generating a delayed output; and
wherein said threshold crossing detector comprises:
first input means receiving a first voltage input signal, said first input means coupled to a first node;
second input means receiving a second voltage input, said second input means coupled to said first node and to an output node;
current mirror means coupled to said second input means at said output node, said current mirror means receiving a first current and generating a second current equivalent to said first current;
positive feedback means coupled to said first input means and said current mirror means, said positive feedback means controlled by an output voltage at said output node;
DC clamping means coupled to said current mirror means increasing a minimum output voltage level.

24. The circuit of claim 23 wherein said DC clamp means is coupled between said output node and said current mirror means.

25. The circuit of claim 23 further including a reset means coupled to said output node.

26. The circuit of claim 23 wherein said DC clamping means is coupled between said current mirror means and a second voltage supply.

27. The circuit of claim 23 wherein said first node comprises a voltage supply node.

28. The circuit of claim 23 further including a current source coupled to said first node.

29. The circuit of claim 23 wherein said first input means, said second input means, and said positive feedback means comprise transistors of a first type, and said current mirror means and said DC clamping means comprise transistors of a second type.

* * * * *